United States Patent
Kamgaing et al.

(10) Patent No.: US 9,419,339 B2
(45) Date of Patent: *Aug. 16, 2016

(54) PACKAGE STRUCTURES INCLUDING DISCRETE ANTENNAS ASSEMBLED ON A DEVICE

(71) Applicant: Intel Corporation, Santa Clara, CA (US)

(72) Inventors: Telesphor Kamgaing, Chandler, AZ (US); Valluri R. Rao, Saratoga, CA (US); Ofir Degani, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/918,508

(22) Filed: Oct. 20, 2015

(65) Prior Publication Data

US 2016/0043471 A1 Feb. 11, 2016

Related U.S. Application Data

(63) Continuation of application No. 13/721,245, filed on Dec. 20, 2012, now Pat. No. 9,166,284.

(51) Int. Cl.
*H04Q 1/38* (2006.01)
*H01Q 9/04* (2006.01)
(Continued)

(52) U.S. Cl.
CPC ............... *H01Q 9/045* (2013.01); *H01P 11/00* (2013.01); *H01Q 1/2283* (2013.01); *H01Q 1/38* (2013.01);
(Continued)

(58) Field of Classification Search
CPC .................. H01Q 1/2283; H01Q 1/38; H01L 2224/16225; H01L 2924/15311; H01P 11/00
USPC .................................................. 343/700 MS
See application file for complete search history.

(56) References Cited

U.S. PATENT DOCUMENTS

| | | | |
|---|---|---|---|
| 2005/0088260 | A1 | 4/2005 | Ajioka et al. |
| 2006/0017636 | A1 | 1/2006 | Sato et al. |

(Continued)

FOREIGN PATENT DOCUMENTS

| | | |
|---|---|---|
| JP | 2006-33034 | 2/2006 |
| JP | 2009-158743 | 7/2009 |

(Continued)

OTHER PUBLICATIONS

Notice of Preliminary Rejection (Non-Final) from the Korean Intellectual Property Office (KIPO) dated Aug. 12, 2015 for Korean Patent Application No. 10-2013-0159091, 8 pages and summary thereof.

(Continued)

*Primary Examiner* — Hoang V Nguyen
(74) *Attorney, Agent, or Firm* — Blakely, Sokoloff, Taylor & Zafman LLP

(57) ABSTRACT

Methods of forming a microelectronic packaging structure and associated structures formed thereby are described. Those methods and structures may include forming a package structure comprising a discrete antenna disposed on a back side of a device, wherein the discrete antenna comprises an antenna substrate, a through antenna substrate via vertically disposed through the antenna substrate. A through device substrate via that is vertically disposed within the device is coupled with the through antenna substrate via, and a package substrate is coupled with an active side of the device.

16 Claims, 7 Drawing Sheets

(51) Int. Cl.

| | | |
|---|---|---|
| *H01P 11/00* | (2006.01) | |
| *H01Q 1/38* | (2006.01) | |
| *H01Q 1/22* | (2006.01) | |
| *H01Q 1/52* | (2006.01) | |
| *H01Q 21/00* | (2006.01) | |

(52) U.S. Cl.
CPC .......... *H01Q 1/526* (2013.01); *H01Q 21/0006* (2013.01); *H01L 2224/16225* (2013.01); *H01L 2924/15311* (2013.01); *Y10T 29/49018* (2015.01)

(56) References Cited

U.S. PATENT DOCUMENTS

| | | |
|---|---|---|
| 2008/0142941 A1 | 6/2008 | Yew et al. |
| 2009/0166811 A1 | 7/2009 | Fujii |
| 2010/0155931 A1 | 6/2010 | Ray et al. |
| 2011/0068433 A1 | 3/2011 | Kim et al. |
| 2011/0205028 A1 | 8/2011 | Pagani et al. |
| 2012/0229345 A1 | 9/2012 | Takaki et al. |
| 2012/0235880 A1 | 9/2012 | Kim et al. |
| 2012/0242547 A1 | 9/2012 | Fujii et al. |
| 2012/0280380 A1 | 11/2012 | Kamgaing |
| 2012/0280860 A1 | 11/2012 | Kamgaing et al. |

FOREIGN PATENT DOCUMENTS

| | | |
|---|---|---|
| JP | 2010-136296 | 6/2010 |
| JP | 2012-015909 | 1/2012 |
| JP | 2012-204848 | 10/2012 |
| KR | 10-2010-0010276 A | 2/2010 |
| KR | 10-2011-0091561 A | 9/2011 |
| KR | 10-2012-0035394 A | 4/2012 |
| KR | 10-2012-0104896 A | 9/2012 |

OTHER PUBLICATIONS

International Search Report and Written Opinion of the International Searching Authority mailed Sep. 27, 2013 for PCT/US2013/048671, International Filing Date Jun. 28, 2013, 12 pages.

Notification Concerning Transmittal of International Preliminary Report on Patentability dated Jul. 2, 2015 citing Written Opinion of the International Searching Authority date of mailing Sep. 27, 2013, International filed Jun. 28, 2013, 11 pages.

Notice of Allowance from the Korean Intellectual Property Office (KIPO) dated Oct. 23, 2015 for Korean Patent Application No. 10-2013-0159091, 2 pages.

First Office Action from the Patent Office of the Chinese State Intellectual Property Office for Chinese Patent Application No. 201310704018.5 dated Apr. 7, 2016, 2 pages.

Office Communication from the Patent Office of the United Kingdom Intellectual Property Office for United Kingdom Patent Application No. GB 1321766.6 dated Jun. 7, 2016.

PACKAGE STRUCTURES INCLUDING DISCRETE ANTENNAS ASSEMBLED ON A DEVICE

This is a Continuation application of Ser. No. 13/721,245 filed Dec. 20, 2012, which is presently pending.

BACK GROUND OF THE INVENTION

The integration of millimeter wave radios operating at 30 GHz or above on platforms allows for the wireless transfer of data between devices or between chips. The successful transfer of data between the devices/chips requires one or more package-level integrated antennas that serve as an interface. Applications such as ultra-short range chip-to-chip communications and post silicon validation of system on a chip (SoC)/central processing unit (CPU) devices using wireless debug ports may suffer from routing losses and loss of package real estate associated with traditional/prior art in package substrate/antenna array designs.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
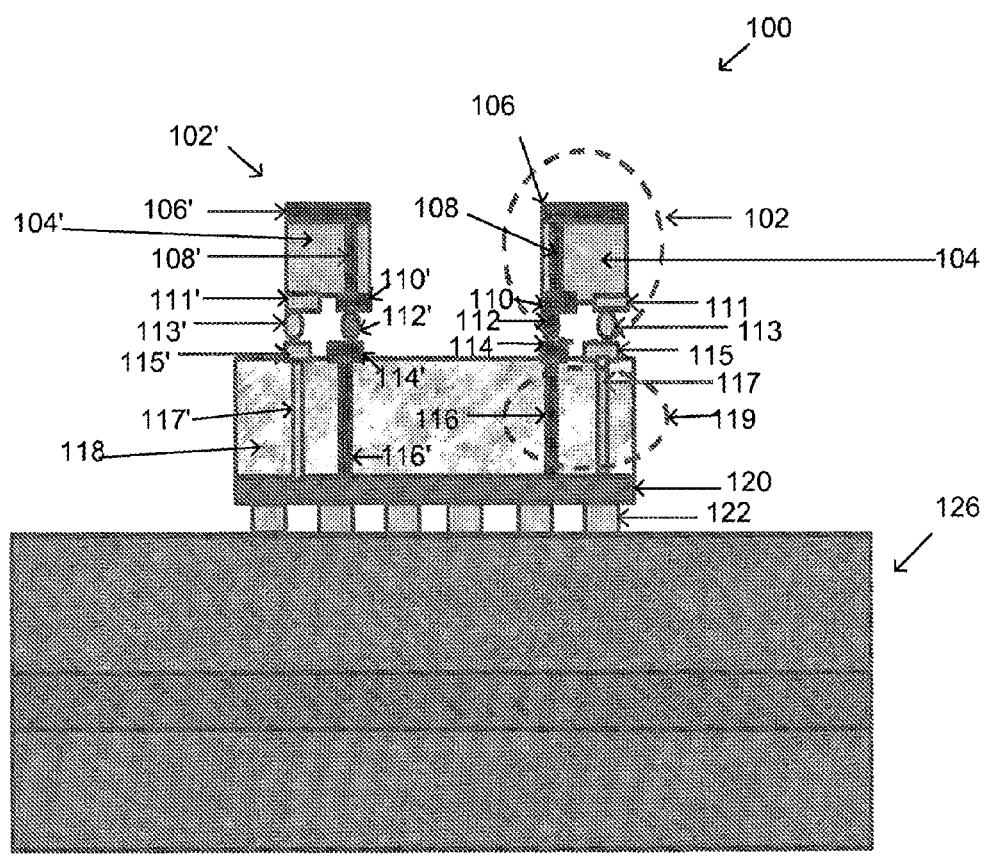
FIGS. 1a-1d represent structures according to various embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods of forming and utilizing microelectronic package structures, such as forming a package structure including discrete antenna disposed on a top surface of a microelectronic device, are described. Those methods and structures may include forming a package structure comprising a discrete antenna disposed on a back side of a device, wherein the discrete antenna comprises an antenna substrate, a through antenna substrate via vertically disposed through the antenna substrate. A through substrate via that is vertically disposed within the device may be coupled with the through antenna substrate via, and a package substrate may be coupled with an active side of the device. The package structures of the various embodiments disclosed herein enable the use of discrete individual antennas for shorter range transmission applications.

FIGS. 1a-1d illustrate embodiments of package structures including at least one discrete antenna disposed on a device. In an embodiment, a package structure 100 comprises at least one discrete antenna 102 (FIG. 1a). The discrete antenna 102 comprises an antenna substrate 104, which may comprise a glass material in some embodiments. In other embodiments, the antenna substrate 104 may comprise at least one of a liquid crystal polymer, an organic material, a low temperature co-fired ceramic, alumina, an undoped silicon, and any high performance, millimeter wave substrate, depending upon the particular application. In an embodiment, the antenna substrate 104 comprises a frequency of about 30 GHz and above. In an embodiment, the antenna substrate 104 may comprise alternating layers of conductive material and dielectric material. In an embodiment, the discrete antenna 102 may comprise a high k dielectric material, which may serve to reduce the dimensions of the discrete antenna 102, in some cases. In an embodiment, the discrete antenna 102 may comprise a radiating element 106 and a through antenna substrate via 108. In an embodiment, the radiating element 106 may comprise multiple levels of metals that may be capacitatively coupled to each other (for example, the radiating element may comprise a plurality of metal layers separated by dielectric material) to enhance the frequency bandwidth of the discrete antenna 102.

In an embodiment, the radiating element 106 may be horizontally disposed on a top portion of the antenna substrate 104, and may be perpendicularly coupled with the through antenna substrate via 108. In an embodiment, the discrete antenna 102 may comprise dimensions that may be less than about 2 mm in width, less than about 2 mm in length and less than about 0.4 mm in height. The dimensions of the discrete antenna 102 may vary depending upon the particular application. In an embodiment, the physical dimensions of the antenna substrate 104 may be much less than the wavelength of the frequency range within which the device/application is capable of operating. In an embodiment, the through antenna substrate via 108 may not be physically coupled to the radiating element 106, wherein a milliwave-wave signal may be electromagnetically coupled between the radiating element 106 and a through substrate via 116.

The through antenna substrate via 108 may be vertically disposed within the antenna substrate 104. An antenna contact 110 may be coupled with the through antenna substrate via 108, and may be disposed on a bottom portion of the antenna substrate 104. An antenna conductive structure 112 may be coupled with the antenna contact 110. A device contact 114, which may comprise a redistribution layer (RDL) 114, may be coupled with the antenna conductive structure 112. The device contact 114 may be disposed on a backside of a device 118. The device 118 may comprise a system on chip (SoC) device comprising a radio 119, such as a millimeter wave radio, in an embodiment, and may comprise any type of device suitable for a particular application, in other embodiments.

A through device substrate via, which may comprise a through substrate via (TSV) 116 may be coupled with the device contact 114, and may be vertically disposed within the device/device substrate 118. In an embodiment, the through substrate via 116 may be lined with an insulator material 121, such as silicon oxide, for example (FIG. 1d, depicting a portion of the device 118 comprising the TSV 116). The through substrate via 116 lined with the insulator 121 may be disposed through a device material 135, which may comprise a silicon substrate material 135 in some cases, and the device 118 may exhibit losses of less than 1 dB in embodiments. The device material 135 may be insulated from the device contact 114 and an active layer/side 120 of the device 118 by an insulating material 137 such as an oxide material, for example.

Referring back to FIG. 1a, the through substrate via 116 may be electrically and physically coupled with the through antenna substrate via 108 (with antenna contact 110, the conductive structure 112 and the device contact 114 coupling in between), wherein the through antenna substrate via 108 coupled with the through substrate via 116 may conduct a signal from the discrete antenna 102 to the device 118. In another embodiment, the through antenna substrate via 108 may be coupled to the through substrate via 116 by one of a conductive structure and metal to metal bonding. In an embodiment, the discrete antenna 102 may comprise a high performance millimeter wave antenna substrate 104 such as glass. The millimeter wave signal that is capable of being emitted/propagated from the radiating element 106 in/on the antenna substrate 104 may be transmitted/propagated between the discrete antenna 102 and the device 118 by the coupling between the through antenna substrate via 108 and the through substrate via 116.

A ground antenna contact 111 may be disposed on the bottom portion of the antenna substrate 104, adjacent the antenna contact 110. A ground antenna conductive structure 113 may be coupled with the ground antenna contact 111. A ground device contact 115 may be coupled with the ground antenna conductive structure 113. The ground device contact 115 may be disposed on a backside of the device 118. A ground through device substrate via 117, which may comprise a ground through substrate via 117, may be coupled with the ground device contact 115, and may be vertically disposed within the device 118. The ground through device substrate via 117 may be adjacent to the signal through substrate via 116, and may provide ground referencing to the discrete antenna 102.

In an embodiment, a second discrete antenna 102' may be disposed on the device 118 and may be adjacent to the discrete antenna 102. The second discrete antenna 102' comprises an antenna substrate 104', and may comprise similar materials as the antenna substrate 104. The second discrete antenna 102' may comprise a radiating element 106' coupled to a through antenna substrate via 108', an antenna contact 110' coupled with the through antenna substrate via 108', and an antenna conductive structure 112' coupled with the antenna contact 110'.

A device contact 114' may be coupled with the antenna conductive structure 112'. The device contact 114' may be disposed on a backside of the device 118. A through device substrate via 116' may be coupled with the device contact 114', and may be vertically disposed within the device 118. The through device substrate via 116' may be electrically and physically coupled with the through antenna substrate via 108'.

A ground antenna contact 111' may be disposed on the bottom portion of the antenna substrate 104', adjacent the antenna contact 110'. A ground antenna conductive structure 113' may be coupled with the ground antenna contact 111'. A ground device contact 115' may be coupled with the ground antenna conductive structure 113'. The ground device contact 115' may be disposed on a backside of the device 118. A ground through substrate via 117', which may comprise a ground through device substrate via 117', may be coupled with the ground device contact 115', and may be vertically disposed within the device 118. The ground through substrate via 117' may be adjacent to the signal through substrate via 116', and may ground reference to the second discrete antenna 102'.

The discrete antennas 102, 102' may be assembled/coupled with the back side of the device 118. In an embodiment, a millimeter wave signal that may be induced between the device and the discrete antennas 102, 102' by the radiating elements 106, 106' may be carried by a series connection between the signal through the substrate vias 116, 116' and the through antenna substrate vias 108, 108'. Additionally, each of the signal vias (which may comprise the series connection between the through the substrate vias 116, 116' and the through antenna substrate vias 108, 108') may be surrounded by one or multiple ground through substrate vias 117, 117', depending upon the particular application. The ground through substrate vias 117, 117' serve as a return path for the millimeter wave signal from the discrete antennas 102, 102'.

The discrete antennas 102, 102' exhibit greatly improved electrical properties as compared with antennas implemented within a package substrate. In addition, the vertical implementation of the TSV's coupled with the vertical through antenna substrate vias frees up package space needed for traditional CPU signal routing, for example, and hence improves the overall compactness of the package structure 100.

In an embodiment, the active side/layer 120 of the device 118 may be coupled with a substrate 126 by solder balls/interconnects 122. In another embodiment, the active side 120 of the device 118 may be coupled with the substrate 126 by direct metal to metal bonding. In an embodiment, the package structure 100 may comprise a 3D package structure 100. In an embodiment, the package structure 100 may comprise a portion of a coreless, bumpless build up layer (BBUL) package structure 100. In another embodiment, the portion of the package structure 100 may comprise any suitable type of package structure 100 capable of providing electrical communications between a microelectronic device(s), such as the devices 102, 102'102", and a next-level component to which the package structure 100 may be coupled (e.g., a circuit board). In another embodiment, the package structures 100 herein may comprise any suitable type of package structures capable of providing electrical communication between a die and an upper integrated circuit (IC) package coupled with a lower IC package.

The substrate 126 of the embodiments herein may comprise a multi-layer substrate 126, including alternating layers of a dielectric material and metal built-up around a core layer (either a dielectric or metal core). In another embodiment, the substrate 126 may comprise a coreless multi-layer substrate 126. Other types of substrates and substrate materials may also find use with the disclosed embodiments (e.g., ceramics, sapphire, glass, etc.).

In an embodiment, the device package structure 100 comprises the device 118 including the millimeter wave radio 119, that may be flip-chip assembled on a multilayer package substrate 126. In another embodiment, a plurality of discrete chip antennas 102 may be formed/coupled on the device 118, wherein the number of discrete antennas 102 coupled with the device 118 may depend upon the particular design requirements. The discrete antennas 102 of the embodiments herein occupy less area on the package substrate 126, and exhibit a significant decrease in signal loss. Additionally, the embodiments require less stringent signal isolation solution, leading to a decrease of package footprint.

Figure 1B:
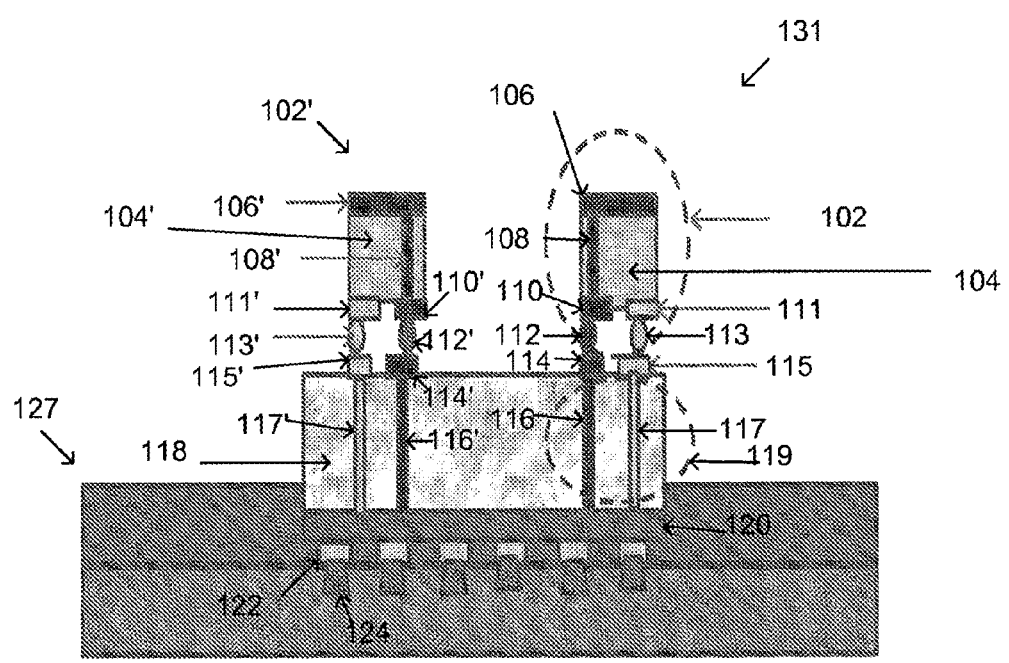

FIG. 1b depicts an embodiment wherein the device 118 (similar to the device 118 and associated package 100 components depicted in FIG. 1a) may be partially embedded in a coreless substrate 127, such as a BBUL substrate 127, for example. Interconnects 122 may be disposed within the substrate 127 and may be coupled with coreless interconnect structures 124. In an embodiment, the package structure 131 may comprise at least two discrete antennas 102, 102'. An advantage of forming/coupling the device 118 and discrete antennas 102, 102' in a partially embedded substrate 127 is an overall Z-height reduction of the package structure 131. In another embodiment, the device 118 and antennas 102, 102' may be fully embedded in the substrate 127.

Figure 1C:
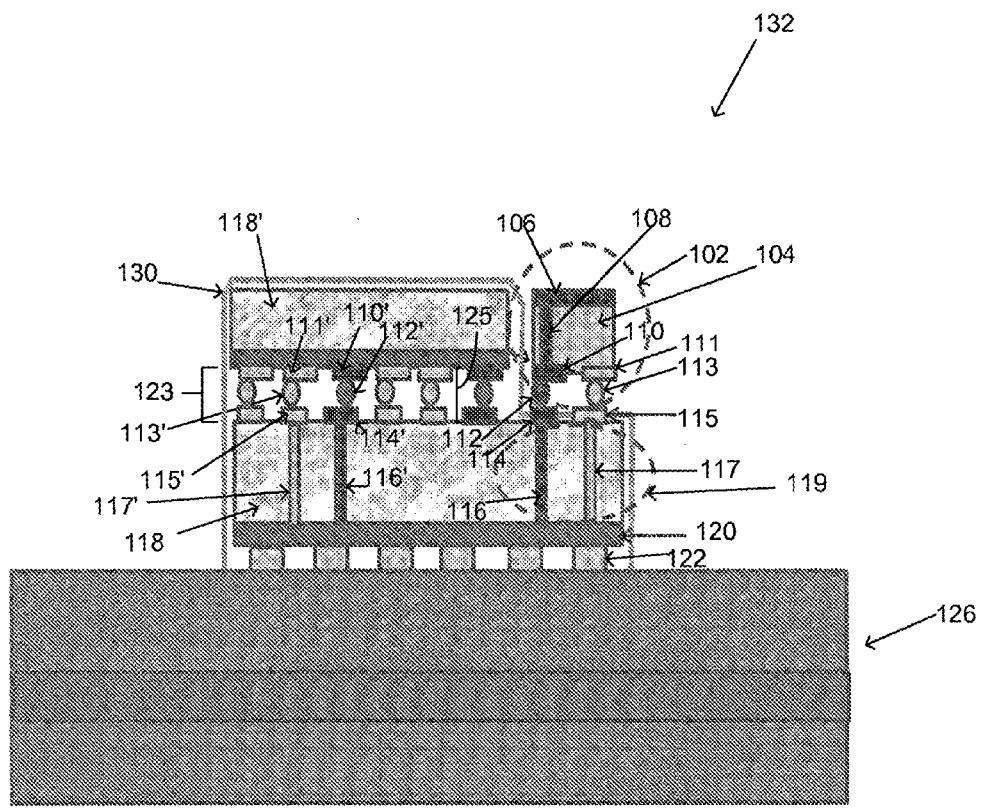
Figure 1D:
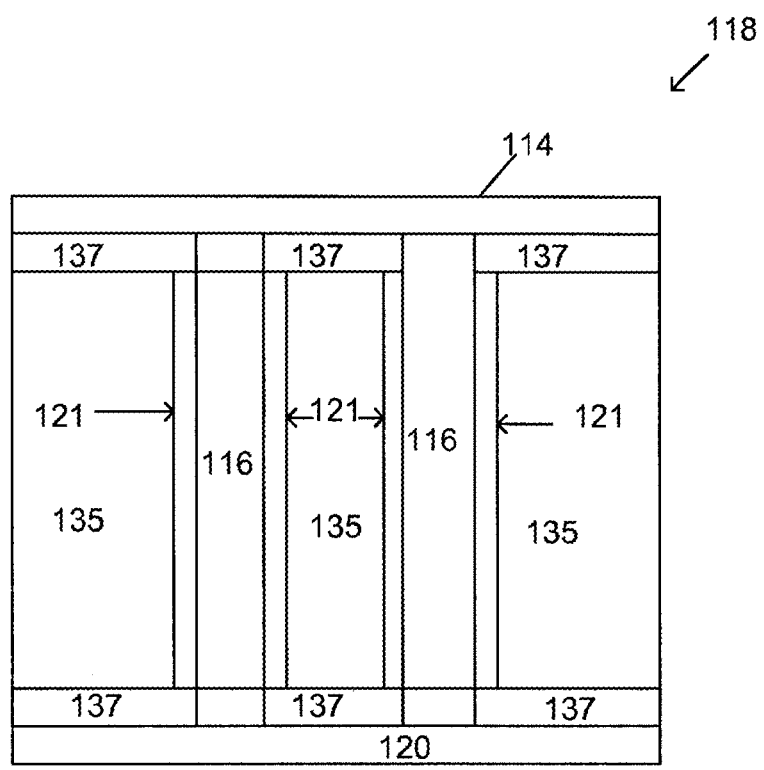

FIG. 1c depicts an embodiment wherein a package structure 132 comprises two devices 118, 118' (similar to the device 118 and associated package 100 components of FIG. 1a) stacked upon one another. The first device/die 118 may be coupled with/disposed on the package substrate 126, which may comprise any type of suitable package substrate 126, and the second device/die 118' may be disposed/stacked on the first device 118. The first device 118 may be coupled with the second device 118' by ground vias 117' and signal vias 116', as well as by ground interconnect structures 123 and signal interconnect structures 125. In an embodiment, the discrete antenna 102 (similar to the discrete antenna of FIG. 1a), may comprise a dimension as small as 1 mm in width and 1 mm in length, and may be stacked on the first device 118 adjacent the second device 118'. In general, the dimensions of the discrete antenna of the embodiments comprise a fraction of the minimum wavelength in the frequency range of a particular application/design.

In an embodiment, the package structure 132 may comprise a system on chip including at least one 3D stacked millimeter wave chip antenna. In some embodiments, a plurality of discrete antennas may be placed/coupled with a backside of the first device 118. In an embodiment, an optional radio frequency interference (RFI) shield 130 may be disposed around/may surround the stacked devices 118, 118'. In some embodiments, the RFI shield may be used to further isolate the discrete antenna(s) from the rest of the package structure components.

The embodiments herein include enablement of 3D integration of discrete antenna with package structures, wherein one or multiple discrete millimeter wave chip antennas are assembled on top of a main system on chip/CPU die/device, wherein the device comprises an integrated mm-wave radio. The antennas may be implemented on high performance millimeter wave substrates, such as glass for example, wherein the millimeter wave signal may be coupled between the discrete antenna and the device using through substrate vias. The embodiments herein support integration of the 3D discrete antennas into such applications as ultra-short range chip-to-chip communication and post silicon validation of SoC/CPU chips using a wireless debug port, for example. Applications such as wireless signal to logic analyzer, and wireless multiple antenna transmission between devices, such as between mobile devices and/or between such devices as DVD and display devices, for example, are enabled herein.

Figure 2:
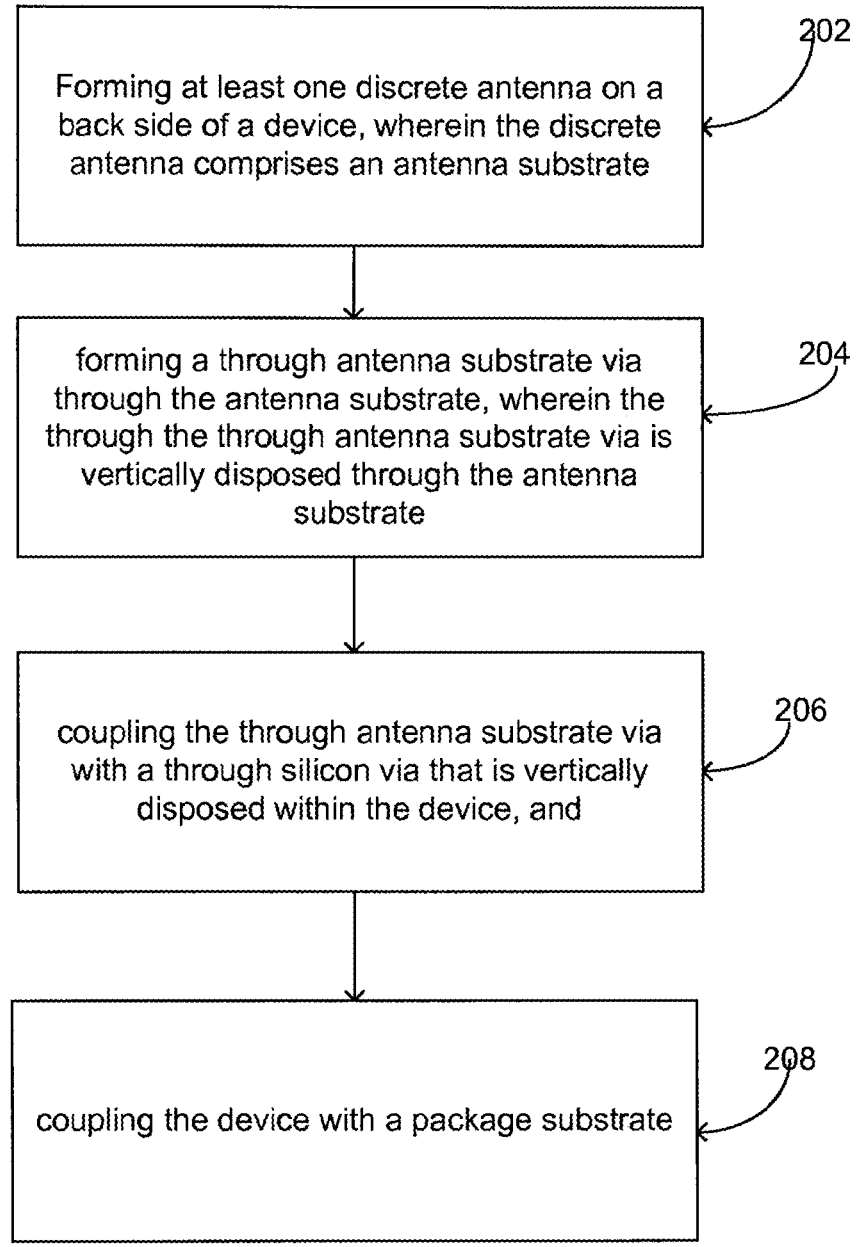
FIG. 2 represents a flow chart according to embodiments.

In another embodiment, a method of forming a package structure is depicted in FIG. 2. At step 202, at least one discrete antenna is formed on a back side of a device, wherein the discrete antenna comprises an antenna substrate. At step 204, a through antenna substrate via is formed through the antenna substrate, wherein the through the through antenna substrate via is vertically disposed through the antenna substrate. At step 206, the through antenna substrate via is coupled with a through substrate via that is vertically disposed within the device, and At step 208, the device is coupled with a package substrate.

Figure 3:
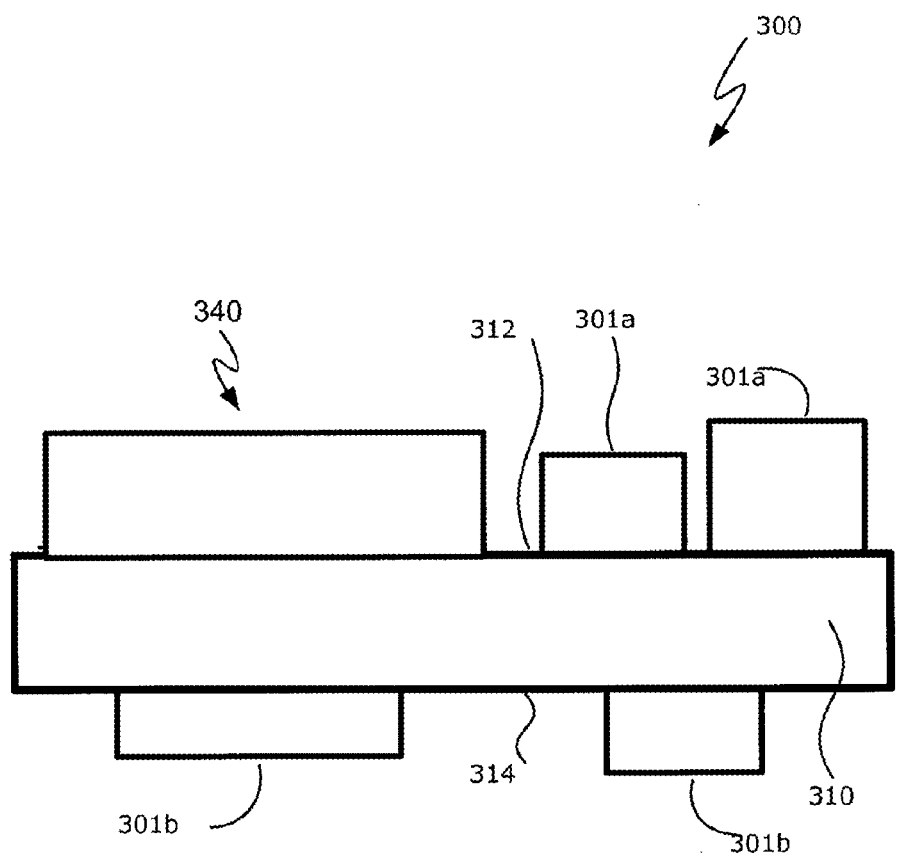
FIG. 3 represents structures according to embodiments.

Turning now to FIG. 3, illustrated is an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340 (which may be similar to the package structure 100 of FIG. 1a, for example) disposed on the mainboard's first side 312, wherein the package structure 340 may comprise any of the microchannel structure embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301a may be disposed on the first side 312 of the mainboard 310, and components 301b may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery— may be electrically coupled with the mainboard 310 (and/or a component disposed on this board) but may be mechanically coupled with the housing.

Figure 4:
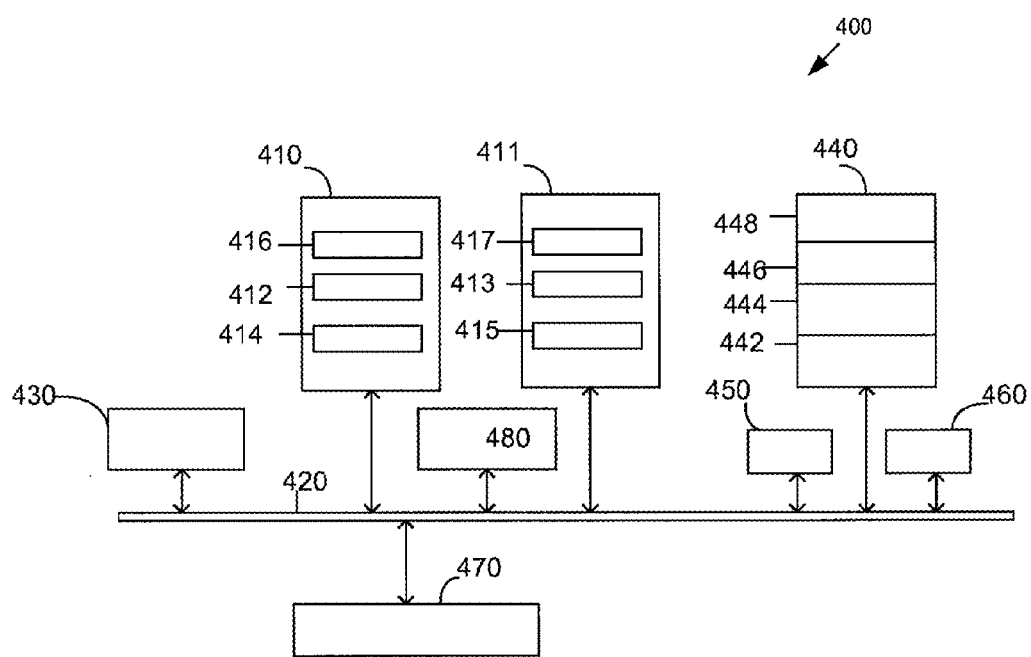
FIG. 4 represents a system according to embodiments.

FIG. 4 is a schematic of a computer system 400 according to an embodiment. The computer system 400 (also referred to as the electronic system 400) as depicted can embody/include a package structure that includes any of the several disclosed embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device of the various embodiments included herein. In an embodiment, the integrated circuit 410 includes a processor 412 that can include any type of packaging structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the package structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A package structure comprising:
  a discrete antenna disposed on a back side of a first device, wherein the discrete antenna comprises an antenna substrate, wherein the antenna substrate comprises alternating layers of conductive material and dielectric material;
  a through antenna substrate via, wherein the through antenna substrate via is vertically disposed through the antenna substrate;
  a through substrate via that is vertically disposed within the first device and coupled with the through antenna substrate via;
  a package substrate coupled with an active side of the first device; and
  a radiating element perpendicularly coupled with the through antenna substrate via and disposed on a top portion of the discrete antenna, wherein the radiating element comprises alternating layers of conductive material and dielectric material.

2. The package structure of claim 1, wherein the through antenna substrate via is coupled to the through substrate via by one of a conductive structure and metal to metal bonding.

3. The package structure of claim 2, wherein the through antenna substrate via coupled to the through substrate via is capable of transmitting a millimeter wave signal.

4. The package structure of claim 1, wherein the antenna substrate comprises a frequency of at least about 30 GHz.

5. The package structure of claim 1, further comprising:
  a ground antenna contact disposed on a bottom portion of the discrete antenna.

6. The package structure of claim 5, wherein the ground antenna contact is coupled to a grounded through substrate via that is vertically disposed in the first device.

7. The package structure of claim 6, wherein the grounded through substrate via is adjacent to the through substrate via.

8. The package structure of claim 1, wherein the first device comprises a silicon on chip that comprises a millimeter wave radio.

9. The package structure of claim 1, wherein an active side of the first device is coupled with the package substrate by one of direct metal to metal bonding and solder bumps.

10. The package structure of claim 1, wherein the package substrate comprises a multilayer package substrate.

11. The package structure of claim 1, wherein the package substrate comprises a BBUL package substrate, and wherein the first device is partially embedded in the BBUL package substrate.

12. The package structure of claim 1, wherein the discrete antenna comprises physical dimensions that are less than a frequency range within which the device is capable of operating.

13. The package structure of claim 1, further comprising:
a plurality of discrete antennas disposed on the first device.

14. The package structure of claim 1, wherein a second device is stacked on the first device.

15. The package structure of claim 14, further comprising:
a radiation shield that surrounds the first device and the second device.

16. The package structure of claim 14, wherein the second device comprises a memory device.

* * * * *